United States Patent
Allott et al.

[11] Patent Number: 6,047,031
[45] Date of Patent: Apr. 4, 2000

[54] ERROR CORRECTION CIRCUIT

[75] Inventors: Stephen Allott, Huddersfield; Craig M Taylor, Shaw, both of United Kingdom

[73] Assignee: Mitel Semiconductor Limited, United Kingdom

[21] Appl. No.: 08/829,723

[22] Filed: Mar. 31, 1997

[30] Foreign Application Priority Data

Apr. 4, 1996 [GB] United Kingdom ............... 9607208

[51] Int. Cl.[7] ............... H04L 25/06; H04L 25/10
[52] U.S. Cl. ............... 375/317; 327/307; 375/319; 371/67.1
[58] Field of Search ............... 375/316, 317, 375/318, 319; 327/175, 63, 72, 77, 306, 307; 371/67.1, 68.1

[56] References Cited

U.S. PATENT DOCUMENTS

| | | | |
|---|---|---|---|
| 4,093,876 | 6/1978 | Henein et al. ............... | 375/317 |
| 4,823,360 | 4/1989 | Tremblay et al. ............... | 375/317 |
| 5,182,476 | 1/1993 | Hanna et al. ............... | 307/491 |
| 5,465,272 | 11/1995 | Smith ............... | 375/295 |
| 5,475,342 | 12/1995 | Nakamura et al. ............... | 375/317 |
| 5,572,158 | 11/1996 | Lee et al. ............... | 327/175 |
| 5,880,615 | 3/1999 | Bazes ............... | 327/307 |
| 5,933,458 | 8/1999 | Leurent et al. ............... | 375/317 |
| 5,933,459 | 8/1999 | Saunders et al. ............... | 375/317 |
| 5,949,819 | 9/1999 | Bjarnason et al. ............... | 375/222 |

FOREIGN PATENT DOCUMENTS

| | | |
|---|---|---|
| 0348643 | 1/1990 | European Pat. Off. . |
| WO 95/22202 | 8/1995 | WIPO . |

*Primary Examiner*—Chi H. Pham
*Assistant Examiner*—Bryan Webster
*Attorney, Agent, or Firm*—Kirschstein, et al.

[57] ABSTRACT

An error correction circuit compensates for baseline wander which can occur when a data signal is passed through a DC isolation stage. The data signal, and its inverse are compared with a common reference level, and the error signal modifies the charge on a capacitor which forms part of a pair of negative feedback loop to control the baseline level.

4 Claims, 2 Drawing Sheets

ERROR CORRECTION CIRCUIT

BACKGROUND OF THE INVENTION

This invention relates to an error correction circuit, and is particularly concerned with data handling arrangements in which data is passed through an DC isolation stage. Such a stage preserves the AC signal component, but the data stream as a whole is free to drift, or float, relative to a particular potential reference, usually earth potential. If the mean potential of the data stream alters significantly, usually referred to as baseline wander, it may not be possible to decode accurately the data, and data errors may thereby be introduced into the data stream.

Circuits are known which have sought to correct for this particular difficulty, but such circuits have required carefully designed filters, and have been subject to instability resulting from the incorporation of positive feedback loops.

SUMMARY OF THE INVENTION

The present invention seeks to provide an improved error correction circuit.

According to this invention an error correction circuit includes a pair of comparators each of which is arranged to receive and compare a respective one of two complementary incoming data streams with a reference level, the outputs of the comparators being arranged to modify the potential across a capacitor, and the capacitor forming part of a pair of respective negative feedback loops, the feedback signal of a respective loop being combined with a respective one of the complementary incoming data streams so as to reduce baseline wander.

Preferably both comparators utilize the same reference potential.

Preferably again the output of both comparators is routed to a charge pump, which in turn has two output ports across which said capacitor is connected. Thus depending on the comparisons performed by the comparators, the potential across the capacitor will be modified, and furthermore the actual potentials on each terminal of the capacitor will change.

BRIEF DESCRIPTION OF THE DRAWINGS

The invention is further described by way of example with reference to the accompanying drawings in which.

DETAILED DESCRIPTION OF THE PREFERRED EMBODIMENTS

Figure 1:
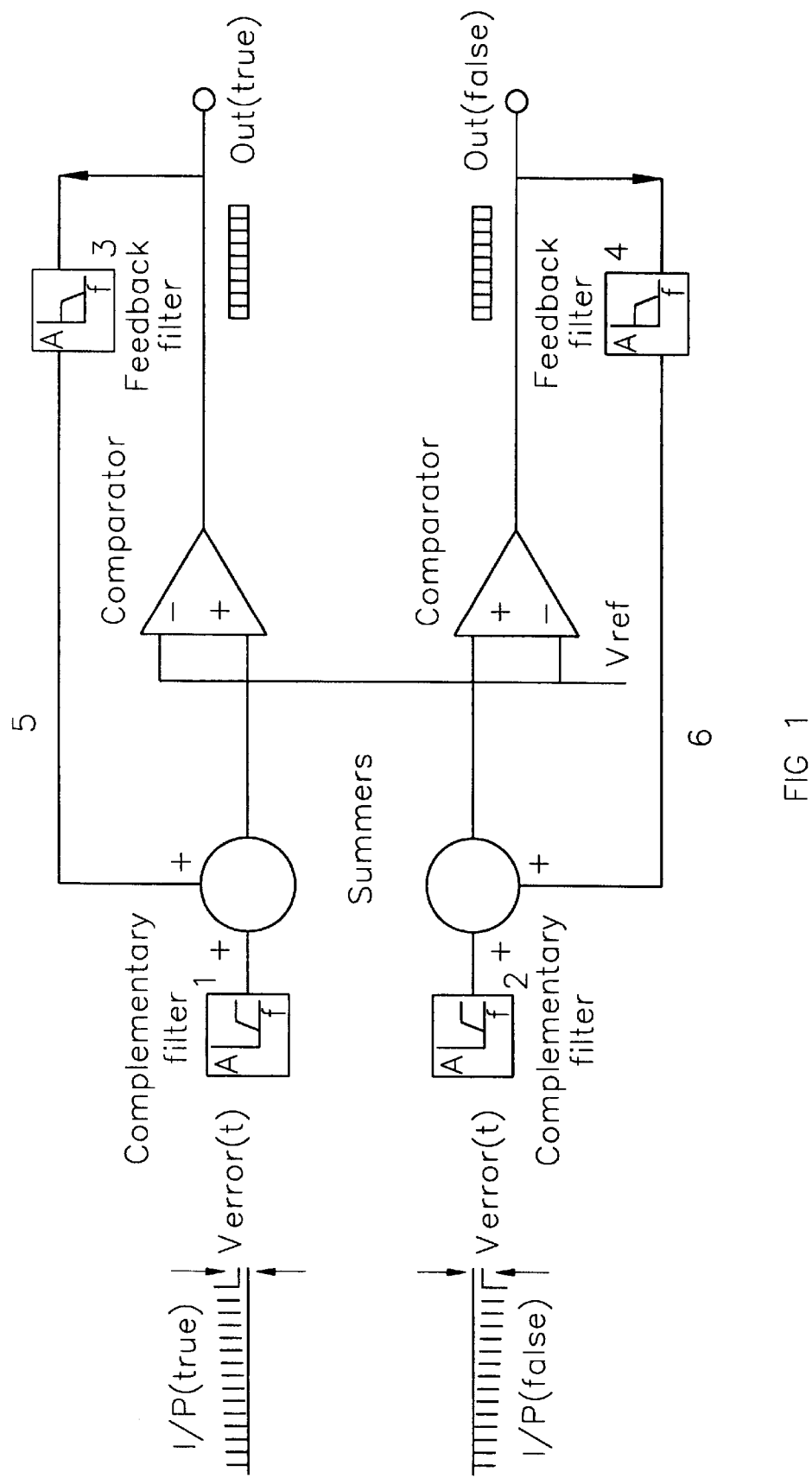
FIG. 1 illustrates a known wander error correction circuit.

Referring to FIG. 1, it will be seen that the known error correction circuit, requires the use of a pair of complementary filters 1,2, 3,4. The correct operation of this circuit demands positive feedback via the feedback loops 5, 6, and as a result the loop gain must be less than unity at all times, and if this condition is not satisfied, due to DC drift in the forward signal path, an irrevocable latch-up condition can result. The filters introduce cost and complexity, and can cause signal degradation.

Figure 2:
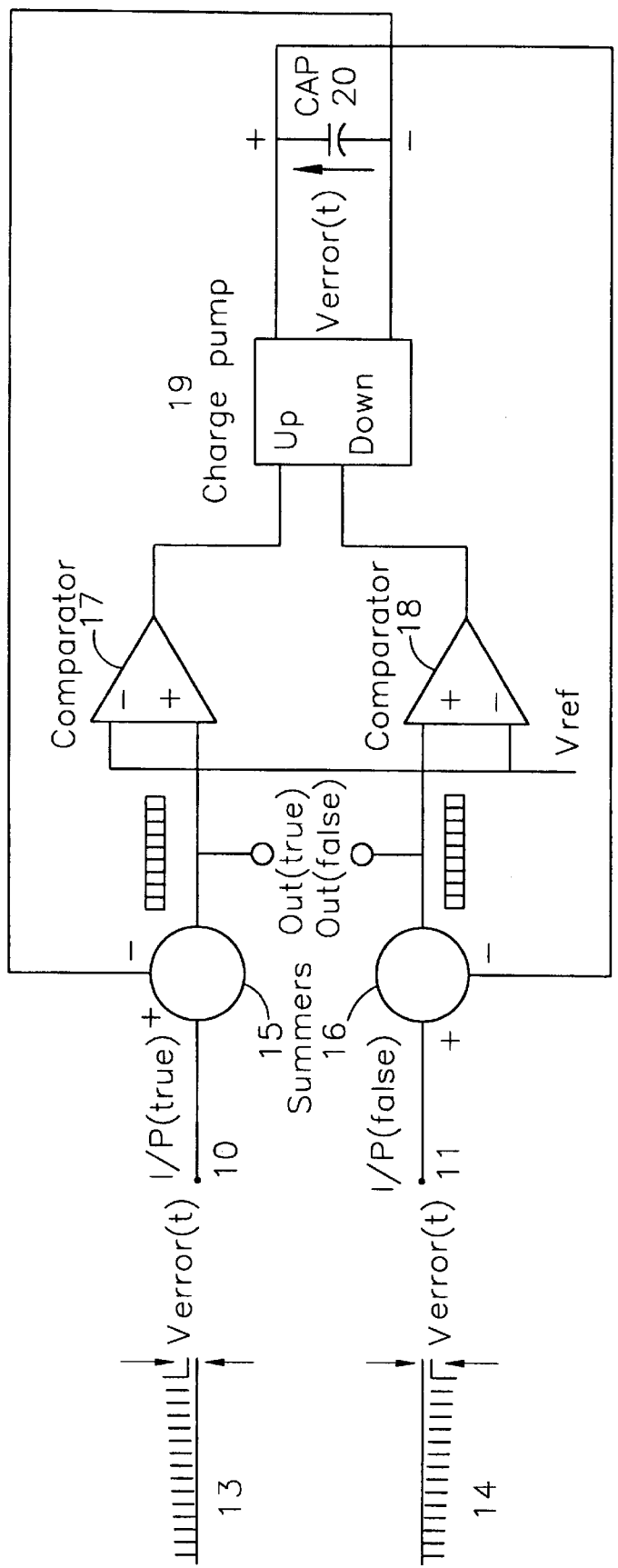
FIG. 2 illustrates an error correction circuit in accordance with the invention.

Referring to FIG. 2, the error correction circuit, which is in accordance with the present invention, has a pair of input ports 10, 11 to which digital data streams are applied. The stream applied to port 10 is the true data, whereas that stream applied to port 11 is its complement, i.e., inverse, and these two data streams typically are generated by a DC isolation transformer. Because of the DC isolation, the baseline can drift, or wander, and this effect is illustrated by the quantity Verror at the representations 13, 14 of the input data streams.

The data streams are passed via respective summers 15, 16 to an input of respective high gain comparators 17, 18, at which the data streams are compared with a common reference potential Vref. The results of the comparisons are applied to the Up-Down inputs of a charge pump 19, which is operative to modify the potential across the terminals of a floating capacitor 20. Thus the potentials on the two terminals of the capacitor are modified in dependence on the outputs of the comparators in response to the comparison of each data bit with the common reference Vref. The positive terminal of the capacitor 20 is connected as part of a negative feedback loop to the other input of summer 16, and the negative terminal of the capacitor 20 is connected as part of another negative feedback loop to the other input of summer 15. The true output data is obtained via terminal 21 connected to summer 15 and the false (complementary) output data is obtained via terminal 22 connected to summer 16.

Any voltage offsets and/or baseline wander on the incoming data, results in the threshold crossings in the comparators 17, 18. These threshold crossings are used to charge/discharge the capacitor 20 via the charge pump 19, and hence to produce an error voltage. As a consequence of high loop gain and negative feedback, the reconstructed error voltage is forced to track the DC and low frequency components of the data signal, and this is used to reduce or eliminate baseline wander.

Typically, the capacitor 20 has a value of 15 pF, and the charge pump current is about 150 $\mu$A. The circuit is intended for data rates of the order of 100 MHz and the maximum baseline frequency is approximately 20 kHz.

As compared with FIG. 1, the absence of in-line filters in FIG. 2 implies that the error correction circuit is transparent to the data signal in the absence of baseline wander errors. Since the circuit utilizes negative feedback, which has a high gain as the comparators have high gain, any DC drift in the forward signal is no longer critical.

We claim:

1. An error correction circuit comprising a pair of comparators each of which is arranged to receive and compare a respective one of two complementary incoming data streams with a reference level, the outputs of the comparators being arranged to modify the potential across a capacitor, and the capacitor forming part of a pair of respective negative feedback loops, the feedback signal of a respective loop being combined with a respective one of the complementary incoming data streams so as to reduce baseline wander.

2. A circuit as claimed in claim 1 and wherein both comparators utilize the same reference potential.

3. A circuit as claimed in claim 1 and wherein the outputs of the two comparators are arranged respectively to control the up/down inputs of a charge pump, so as to control and modify the potential across said capacitor.

4. A circuit as claimed in claim 1 and wherein said negative feedback loops each include a summer in the input path to a respective comparator, the summer thereby responding to variations of potential on said capacitor.

* * * * *